United States Patent
Yan et al.

(10) Patent No.: US 7,871,855 B2
(45) Date of Patent: Jan. 18, 2011

(54) USE OF AXIAL SUBSTITUTED PHTHALOCYANINE COMPOUND FOR PREPARING ORGANIC THIN-FILM TRANSISTOR

(75) Inventors: Donghang Yan, Changchun (CN); De Song, Changchun (CN); Feng Zhu, Changchun (CN); Bo Yu, Changchun (CN)

(73) Assignee: Changchun Institute of Applied Chemistry Chinese Academy of Sciences, Changchun, Jilin Province (CN)

( * ) Notice: Subject to any disclaimer, the term of this patent is extended or adjusted under 35 U.S.C. 154(b) by 413 days.

(21) Appl. No.: 12/009,526

(22) Filed: Jan. 17, 2008

(65) Prior Publication Data

US 2008/0177060 A1 Jul. 24, 2008

(30) Foreign Application Priority Data

Jan. 23, 2007 (CN) .......................... 2007 1 0055258

(51) Int. Cl.
 *H01L 51/40* (2006.01)
(52) U.S. Cl. ................. 438/99; 438/149; 257/E51.024; 257/E51.027; 540/122; 540/139
(58) Field of Classification Search ................. 540/122, 540/128, 139; 438/99, 149; 257/E51.024, 257/E51.027
See application file for complete search history.

(56) References Cited

U.S. PATENT DOCUMENTS 5,969,376 A 10/1999 Bao

2009/0181493 A1* 7/2009 Miyamoto .................... 438/99

FOREIGN PATENT DOCUMENTS

CN 1398004 A 2/2003

OTHER PUBLICATIONS

Zhenan Bao, et al. 1998 "New Air-Stable n-Channel Organic Thin Film Transistors" *J American Chemical Society* 120:207-208.
Mang-Mang Ling and Zhenan Bao 2006 "Air-stable *n*-channel copper hexachlorophthalocyanine for field-effect transistors" *Applied Physics Letters* 89:163516 (in 3 pages).
James E. Owen and Malcolm E Kenney 1962 "Phthalocyaninoaluminum Compounds" *Inorganic Chemistry* 1:331-333.
R Decréau, et al. 1999 "Synthesis and characterization of a series of hexadecachlorinated phthalocyanines" *Inorganica Chimica Acta* 293:80-87.

* cited by examiner

*Primary Examiner*—Matthew C Landau
*Assistant Examiner*—Colleen E Snow
(74) *Attorney, Agent, or Firm*—Knobbe Martens Olson & Bear LLP

(57) ABSTRACT

This invention relates to the use of axial substituted phthalocyanine compound as a semiconductor layer between the source/drain electrodes of organic thin-film transistor. The centre ligand of the axial substituted phthalocyanine compound is an atom with 3 valences or higher, and the axial ligands are chlorine, fluorine, or oxygen which can be connected with the centre ligands of axial substituted phthalocyanine compounds. Crystalline Film with high quality can be prepared on an organic substrate from the axial substituted phthalocyanine compound using vapor deposition process. These crystalline films have high carrier mobility, rich energy level, and stable performances and are easy for integrated process. The field effect mobility and the on/off Ratio of the organic thin-film transistor are 0.01 $cm^2/Vs$ or more and higher than $10^5$, respectively.

4 Claims, 3 Drawing Sheets

(a)

(b)

(a)

(b)

USE OF AXIAL SUBSTITUTED PHTHALOCYANINE COMPOUND FOR PREPARING ORGANIC THIN-FILM TRANSISTOR

FIELD OF THE INVENTION

The present invention relates to the use of axial substituted phthalocyanine compound for preparing organic thin-film transistor.

DESCRIPTION OF THE RELATED ART

Organic semiconductors with the property of high carrier mobility have application prospects in the applications of information display, integrated circuits, photovoltaic cells and sensors etc. However, at present most of the organic semiconductors show sensitivity to circumstances, which brings great difficulties to the integrated processing and application of organic electronic devices. U.S. Pat. No. 5,969,376 disclosed a p-channel organic thin-film transistor using planar metal phthalocyanines [copper phthalocyanine (CuPc), zinc phthalocyanine (ZnPc), free phthalocyanine (H2Pc), stannum phthalocyanine (SnPc)]. In 1998, Journal of the American Chemical Society (J. Am. Chem. Soc. 1998, 120, 207-208) reported an n-channel organic thin-film transistor using planar metal phthalocyanines [metal hexadecafluoro phthalocyanine (F16MPc), ferrum hexadecachloro phthalocyanine (Cl16FePc), octacyano substituted copper phthalocyanine ((CN)8CuPc)]. In 2006, Applied Physics Letter (Appl. Phys. Lett. 89, 163516 (2006)) reported an n-channel organic thin-film transistor using planar metal phthalocyanines [copper hexadecachloro phthalocyanine (Cl16CuPc)]; Chinese Patent No. 02129458.5 disclosed a p-channel organic thin-film transistor using nonplanar metal phthalocyanines [titanium oxygen phthalocyanine (TiOPc), vanadium oxygen phthalocyanine (VOPc)]. These organic semiconductors with mobility of 10-3 cm2/Vs or more are not sensitive to circumstances, work steadily and are suitable for integrated process. In order to further meet the demand of the development of organic electronic devices, it is required to further enhance and enrich the carrier mobility and the electron structures of semiconductors.

SUMMARY OF THE INVENTION

The invention aims to provide the use of axial substituted phthalocyanine compound for preparing organic thin-film transistor, and relates to the use of axial substituted phthalocyanine compound for preparing the semiconductor layer between the source and drain electrodes of organic thin-film transistor. The field effect mobility and the on/off ratio of the organic thin-film transistor using axial substituted phthalocyanine compound as semiconductor layer between the source and drain electrodes are 0.01 cm$^2$ Vs or more and higher than $10^5$, respectively.

The molecular structure schemes of axial substituted phthalocyanine compounds are shown in the FIG. 1(a) and FIG. 1(b).

In which: FIG. 1(a) shows the axial substituted phthalocyanine, M represents the centre substituted ligand, and L, L' represent the axial ligands, wherein L and L' can be the same or different from each other; and FIG. 1(b) shows the positions of the substituents on phenyl group: the substituted atoms of 1, 2, 3, 4, 8, 9, 10, 11, 15, 16, 17, 18, 22, 23, 24, 25 can be fluorine (F), chlorine (Cl). As an example, chloroaluminum hexadecachloro phthalocyanine (Cl$_{16}$AlClPc) can be mentioned.

The centre ligand of axial substituted phthalocyanine compounds is an atom with 3 valences or more, and the axial ligands are chlorine (Cl), fluorine (F), oxygen (O) which can be connected with the centre ligands of axial substituted phthalocyanine compounds.

The principle of the invention is that centre ligand and axial ligand can adjust the electron structure of axial substituted phthalocyanine.

The axial substituted phthalocyanine compound is one selected from the group consisting of indium fluorine phthalocyanine (InFPc), titanium difluorine phthalocyanine (TiF$_2$Pc), stannum difluorine phthalocyanine (SnF$_2$Pc), ferrum chlorine phthalocyanine (FeClPc), indium chlorine phthalocyanine (InClPc), gallium chlorine phthalocyanine (GaClPc), manganese chlorine phthalocyanine (MnClPc), stannum oxygen phthalocyanine (SnOPc), titanium dichlorine phthalocyanine (TiCl$_2$Pc), stannum dichlorine phthalocyanine (SnCl$_2$Pc), germanium dichlorine phthalocyanine (GeCl$_2$Pc), oxygen titanium hexadecafluoro phthalocyanine (F$_{16}$TiOPc), oxygen titanium hexadecachloro phthalocyanine (Cl$_{16}$TiOPc), oxygen vanadium hexadecafluoro phthalocyanine (F$_{16}$VOPc), oxygen vanadium hexadecachloro phthalocyanine (Cl$_{16}$VOPc), indium chlorine hexadecafluoro phthalocyanine (F$_{16}$InClPc), indium chlorine hexadecachloro phthalocyanine (Cl$_{16}$InClPc), stannum dichlorine hexadecafluoro phthalocyanine (F$_{16}$SnCl$_2$Pc), stannum dichlorine hexadecachloro phthalocyanine (Cl$_{16}$SnCl$_2$Pc), titanium dichlorine hexadecafluoro phthalocyanine (F$_{16}$TiCl$_2$Pc), manganese chlorine hexadecafluoro phthalocyanine (F$_{16}$MnClPc), aluminium chlorine hexadecafluoro phthalocyanine (F$_{16}$AlClPc) and aluminium chlorine hexadecachloro phthalocyanine (Cl$_{16}$AlClPc).

The thickness of the semiconductor layer between the source and drain electrodes of the organic thin-film transistor prepared from said axial substituted phthalocyanine compound is between 10-50 nm.

Crystalline film with high quality can be prepared on organic substrate from said axial substituted phthalocyanine compound using vapour deposition process. These crystalline films have high carrier mobility, rich energy level, stable performances and are easy for integrated process. The field effect mobility and the on/off ratio of the organic thin-film transistor using axial substituted phthalocyanine compound as the semiconductor layer between the source and drain electrodes are no less than 0.01 cm$^2$/Vs and higher than $10^5$, respectively.

The structure of the organic thin-film transistor using axial substituted phthalocyanine compound as the semiconductor layer between the source and drain electrodes is shown in FIG. 2 in which: (1) represents substrate, (2) grid, (3) insulated gate layer, (5) and (6) source electrode and drain electrode, (7) semiconductor layer of the axial substituted phthalocyanine compounds.

BRIEF DESCRIPTION OF THE DRAWINGS

FIG. 1 shows the molecular structure formula of the axial substituted phthalocyanine compound, in which: FIG. 1(a) shows the axial substituted phthalocyanine, M represents the centre substituted ligand, and L, L' represent the axial ligands, wherein L and L' can be the same or different from each other (for example, titanium dichlorine phthalocyanine (TiCl$_2$Pc)); and (b) shows the positions of the substituents on phenyl group: the substituted atoms of 1, 2, 3, 4, 8, 9, 10, 11, 15, 16, 17, 18, 22, 23, 24, 25 can be fluorine (F), chlorine (Cl) (for example aluminum chlorine hexadecachloro phthalocyanine (Cl$_{16}$AlClPc)).

DETAILED DESCRIPTION OF THE PREFERRED EMBODIMENT

Figure 1:
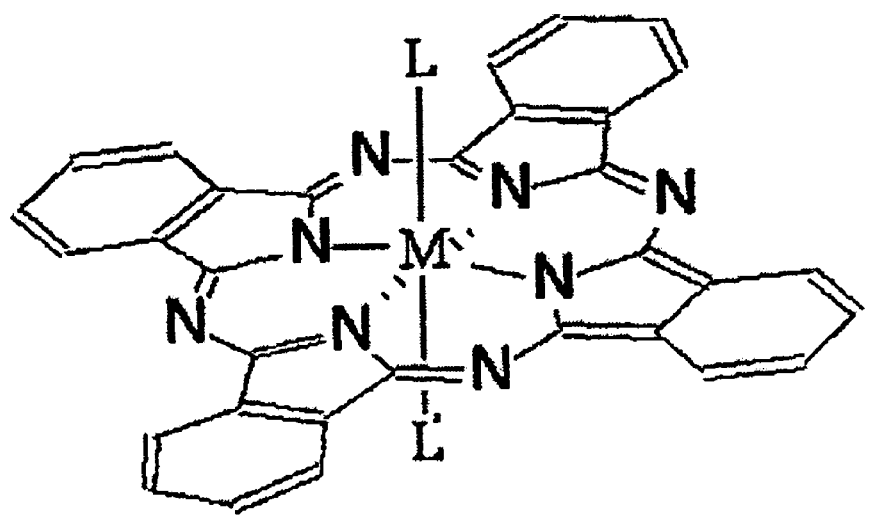
Figure 1:
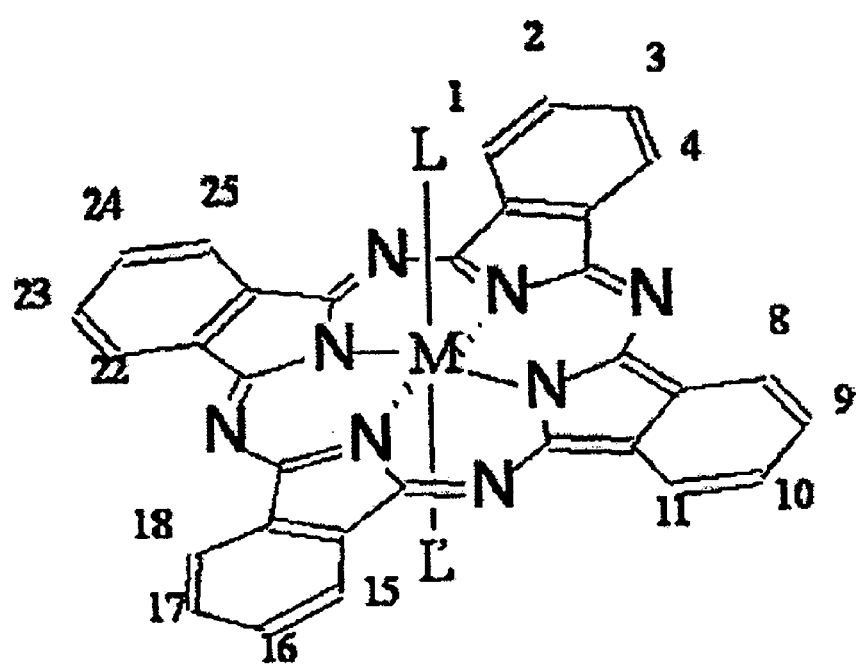
Figure 2:
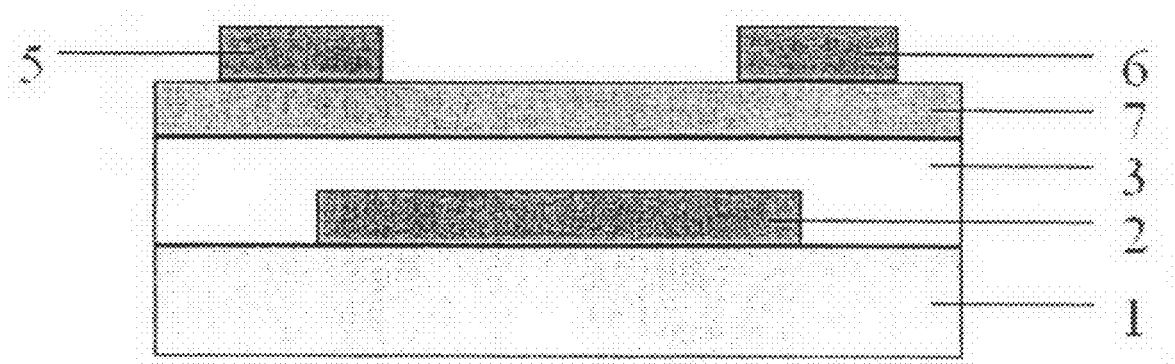
FIG. 2 shows the structural scheme of the thin-film transistor, wherein, (1) represents substrate, (2) grid, (3) insulated gate layer, (5) and (6) source and drain electrodes, (7) semiconductor layer of the axial substituted phthalocyanine compound.
Figure 3:
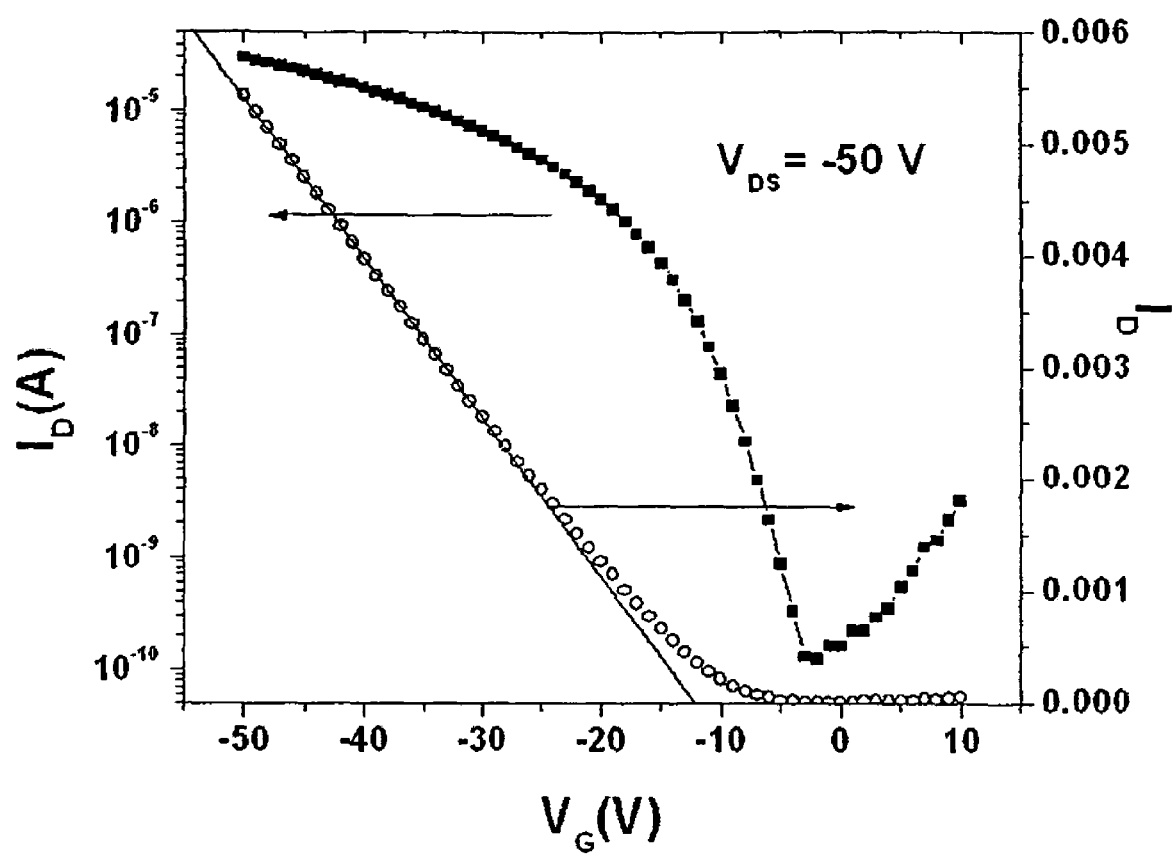
FIG. 3 shows the transfer characteristic curve of $TiCl_2Pc$.

The present invention will be described below in combination with appended drawings. FIG. 2 is one example of the structure using top-touch type thin-film transistor of the organic semiconductor according to the present invention.

Example 1

The tantalum pentoxide ($Ta_2O_5$), silicon dioxide ($SiO_2$) and aluminum oxide ($Al_2O_3$) targets, and the gold (Au) and aluminum (Al) metal electrodes used in the example are commercial products, and can be used directly. Glass substrates and plastic substrates are commercial products and can be used after cleaning. The ferrum chlorine phthalocyanine (FeClPc), titanium dichlorine phthalocyanine ($TiCl_2Pc$), stannum dichlorine phthalocyanine ($SnCl_2Pc$), indium chlorine phthalocyanine (InClPc), manganese chlorine phthalocyanine (MnClPc), gallium chlorine phthalocyanine (GaClPc), stannum oxygen phthalocyanine (SnOPc) used as the axial substituted phthalocyanine compounds in the example are commercial products and can be used after purification. Polymethyl methacrylate (PMMA) is commercial product, and was formulated into 3-0.5 wt % butanone solution for use.

A layer of metal chromium (Cr) film with the thickness of about 200 nm was plated on 7059 glass substrate or flexible plastic substrate (1) by radio frequency magnetron sputtering method, and was photoetched into grid (2); on grid (2), a layer of tantalum pentoxide ($Ta_2O_5$), silicon dioxide ($SiO_2$) or aluminum oxide ($Al_2O_3$) was formed as insulated gate layer (3) with the thickness of about 100 nm by magnetron sputtering method, and PMMA with the thickness of 50 nm was spinning coated on the surface of insulated gate layer (3); then semiconductor (7) with the thickness of 10 to 30 nm was grown by molecule vapour deposition process at the temperature between 25 to 250° C., source and drain electrodes (5) and (6) of gold (Au) and aluminum (Al) with the thickness of 20-50 nm were then deposited.

The source and drain electrodes, surface modification layer, and properties of the carrier mobility ($cm^2/Vs$), types of the carriers, and on/off current ratio of thin-film transistor are listed in Table 1.

TABLE 1

Source and drain electrodes of thin-film transistor device, and properties of carrier mobility ($cm^2/Vs$), types of the carriers and on/off current ratio of the thin-film transistor device

| Organic semiconductor | source and drain electrodes | carrier mobility | carrier type | on/off current ratio |
|---|---|---|---|---|
| $TiCl_2Pc$ | Au | 0.15 | hole | $10^5$ |
| $SnCl_2Pc$ | Al | 0.16 | electron | $10^5$ |
| $SnCl_2Pc$ | Au | 0.14 | electron | $10^5$ |
| FeClPc | Au | 0.011 | hole | $10^5$ |
| InClPc | Au | 0.025 | hole | $10^5$ |
| MnClPc | Au | 0.011 | hole | $10^5$ |
| GaClPc | Au | 0.010 | hole | $10^5$ |
| SnOPc | Al | 0.017 | electron | $10^5$ |
| SnOPc | Au | 0.020 | electron | $10^5$ |

Example 2

Tantalum pentoxide ($Ta_2O_5$), silicon dioxide ($SiO_2$) and aluminum oxide ($Al_2O_3$) used as targets in the example and gold (Au) and aluminum (Al) metal electrodes in the example are commercial products and can be used directly. Glass substrates and plastic substrates are commercial products and can be used after cleaning. Titanium difluorine phthalocyanine ($TiF_2Pc$), stannum difluorine phthalocyanine ($SnF_2Pc$), indium fluorine phthalocyanine (InFPc), germanium dichlorine phthalocyanine ($GeCl_2Pc$), oxygen titanium hexadecafluoro phthalocyanine ($F_{16}TiOPc$), oxygen vanadium hexadecafluoro phthalocyanine ($F_{16}VOPc$), indium chlorine hexadecafluoro phthalocyanine ($F_{16}InClPc$), manganese chlorine hexadecafluoro phthalocyanine ($F_{16}MnClPc$), stannum dichlorine hexadecafluoro phthalocyanine ($F_{16}SnCl_2Pc$), titanium dichlorine hexadecafluoro phthalocyanine ($F_{16}TiCl_2Pc$), aluminium chlorine hexadecafluoro phthalocyanine ($F_{16}AlClPc$), aluminium chlorine hexadecachloro phthalocyanine ($Cl_{16}AlClPc$), stannum dichlorine hexadecachloro phthalocyanine ($Cl_{16}SnCl_2Pc$), oxygen titanium hexadecachloro phthalocyanine ($Cl_{16}TiOPc$), oxygen vanadium hexadecafluoro phthalocyanine ($Cl_{16}VOP_c$), indium chlorine hexadecachloro phthalocyanine ($Cl_{16}InClPc$) were synthesized according to literature (*Inorg. Chem.* 1962, 1, 331-333; *Inorganica Chimica Acta* 1999, 293, 80-87).

A layer of metal chromium (Cr) film with the thickness of about 200 nm was plated on 7059 glass substrate or flexible plastic substrate (1) by radio frequency magnetron sputtering method, and was photoetched into grid (2); on grid (2) a layer of tantalum pentoxide ($Ta_2O_5$), silicon dioxide ($SiO_2$) or aluminum oxide ($Al_2O_3$) as insulated gate layer (3) with the thickness of about 100 nm was formed by magnetron sputtering method, and the surface of insulated gate layer (3) was modified by octadecyltrichlorosilane (hereinafter referred to as OTS), or was deposited with para-sexiphenyl (hereinafter referred to as 6P) by vacuum deposition; then semiconductor (7) with the thickness of 10 to 30 nm was grown by molecule vapor deposition process at the temperature between 25 to 250° C., and then the source and drain electrodes (5) and (6) of gold (Au) and aluminum (Al) with the thickness of 20-50 nm was also deposited.

The source and drain electrodes, surface modification layer, properties of the carrier mobility, and on/off current ratio of the thin-film transistor device are listed in Table 2.

TABLE 2

Source and drain electrodes, surface modification layer, properties of carrier mobility ($cm^2/Vs$), carrier types and on/off current ratio of the thin-film transistor device

| Organic semiconductor | source and drain electrodes | surface modification layer | carrier mobility | carrier type | on/off current ratio |
|---|---|---|---|---|---|
| $F_{16}AlClPc$ | Al | OTS | 0.012 | electron | $10^5$ |
| $F_{16}AlClPc$ | Al | 6P | 0.023 | electron | $10^5$ |
| $F_{16}AlClPc$ | Au | OTS | 0.010 | electron | $10^5$ |
| $F_{16}AlClPc$ | Al | 6P | 0.017 | electron | $10^5$ |
| $F_{16}MnClPc$ | Al | OTS | 0.016 | electron | $10^5$ |
| $F_{16}MnClPc$ | Al | 6P | 0.014 | electron | $10^5$ |
| $F_{16}MnClPc$ | Au | OTS | 0.012 | electron | $10^5$ |
| $F_{16}MnClPc$ | Au | 6P | 0.021 | electron | $10^5$ |
| $F_{16}InClPc$ | Al | OTS | 0.015 | electron | $10^5$ |
| $F_{16}InClPc$ | Al | 6P | 0.21 | electron | $10^5$ |
| $F_{16}InClPc$ | Au | OTS | 0.012 | electron | $10^5$ |
| $F_{16}InClPc$ | Au | 6P | 0.27 | electron | $10^5$ |
| $F_{16}SnCl_2Pc$ | Al | OTS | 0.010 | electron | $10^5$ |
| $F_{16}SnCl_2Pc$ | Al | 6P | 0.11 | electron | $10^5$ |
| $F_{16}SnCl_2Pc$ | Au | OTS | 0.013 | electron | $10^5$ |
| $F_{16}SnCl_2Pc$ | Au | 6P | 0.24 | electron | $10^5$ |

TABLE 2-continued

Source and drain electrodes, surface modification layer, properties of carrier mobility (cm$^2$/Vs), carrier types and on/off current ratio of the thin-film transistor device

| Organic semiconductor | source and drain electrodes | surface modification layer | carrier mobility | carrier type | on/off current ratio |
|---|---|---|---|---|---|
| $F_{16}TiCl_2Pc$ | Al | OTS | 0.011 | electron | $10^5$ |
| $F_{16}TiCl_2Pc$ | Al | 6P | 0.021 | electron | $10^5$ |
| $F_{16}TiCl_2Pc$ | Au | OTS | 0.017 | electron | $10^5$ |
| $F_{16}TiCl_2Pc$ | Au | 6P | 0.26 | electron | $10^5$ |
| $F_{16}TiOPc$ | Al | OTS | 0.11 | electron | $10^5$ |
| $F_{16}TiOPc$ | Al | 6P | 0.20 | electron | $10^5$ |
| $F_{16}TiOPc$ | Au | OTS | 0.21 | electron | $10^5$ |
| $F_{16}TiOPc$ | Au | 6P | 0.43 | electron | $10^5$ |
| $F_{16}VOPc$ | Al | OTS | 0.12 | electron | $10^5$ |
| $F_{16}VOPc$ | Al | 6P | 0.17 | electron | $10^5$ |
| $F_{16}VOPc$ | Au | OTS | 0.23 | electron | $10^5$ |
| $F_{16}VOPc$ | Au | 6P | 0.39 | electron | $10^5$ |
| $Cl_{16}SnCl_2Pc$ | Al | OTS | 0.012 | electron | $10^5$ |
| $Cl_{16}SnCl_2Pc$ | Al | 6P | 0.017 | electron | $10^5$ |
| $Cl_{16}SnCl_2Pc$ | Au | OTS | 0.023 | electron | $10^5$ |
| $Cl_{16}SnCl_2Pc$ | Au | 6P | 0.17 | electron | $10^5$ |
| $Cl_{16}AlClPc$ | Al | OTS | 0.014 | electron | $10^5$ |
| $Cl_{16}AlClPc$ | Al | 6P | 0.022 | electron | $10^5$ |
| $Cl_{16}AlClPc$ | Au | OTS | 0.013 | electron | $10^5$ |
| $Cl_{16}AlClPc$ | Au | 6P | 0.017 | electron | $10^5$ |
| $Cl_{16}InClPc$ | Al | OTS | 0.015 | electron | $10^5$ |
| $Cl_{16}InClPc$ | Al | 6P | 0.019 | electron | $10^5$ |
| $Cl_{16}InClPc$ | Au | OTS | 0.16 | electron | $10^5$ |
| $Cl_{16}InClPc$ | Au | 6P | 0.21 | electron | $10^5$ |
| $Cl_{16}VOPc$ | Al | OTS | 0.010 | electron | $10^5$ |
| $Cl_{16}VOPc$ | Al | 6P | 0.073 | electron | $10^5$ |
| $Cl_{16}VOPc$ | Au | OTS | 0.042 | electron | $10^5$ |
| $Cl_{16}VOPc$ | Au | 6P | 0.37 | electron | $10^5$ |
| $Cl_{16}TiOPc$ | Al | OTS | 0.012 | electron | $10^5$ |
| $Cl_{16}TiOPc$ | Al | 6P | 0.012 | electron | $10^5$ |
| $Cl_{16}TiOPc$ | Au | OTS | 0.016 | electron | $10^5$ |
| $Cl_{16}TiOPc$ | Au | 6P | 0.023 | electron | $10^5$ |
| $SnF_2Pc$ | Al | OTS | 0.010 | electron | $10^5$ |
| $SnF_2Pc$ | Al | 6P | 0.018 | electron | $10^5$ |
| $SnF_2Pc$ | Au | OTS | 0.051 | electron | $10^5$ |
| $SnF_2Pc$ | Au | 6P | 0.074 | electron | $10^5$ |
| $TiF_2Pc$ | Al | OTS | 0.012 | electron | $10^5$ |
| $TiF_2Pc$ | Al | 6P | 0.025 | electron | $10^5$ |
| $TiF_2Pc$ | Au | OTS | 0.042 | electron | $10^5$ |
| $TiF_2Pc$ | Au | 6P | 0.085 | electron | $10^5$ |
| InFPc | Al | OTS | 0.017 | electron | $10^5$ |
| InFPc | Al | 6P | 0.024 | electron | $10^5$ |
| InFPc | Au | OTS | 0.031 | electron | $10^5$ |
| InFPc | Au | 6P | 0.077 | electron | $10^5$ |
| $GeCl_2Pc$ | Au | OTS | 0.061 | hole | $10^5$ |
| $GeCl_2Pc$ | Au | 6P | 0.090 | hole | $10^5$ |

The present invention is not limited to the examples described above. Generally, the organic transistor disclosed in the present invention can be made into components in two dimensional or three dimensional integrated devices. These integrated devices can be used in the applications of flexible integrated circuits, active matrix display etc. The components using organic thin-film transistor according to the present invention can be processed at low temperature.

What is claimed is:

1. A method for preparing an organic thin-film transistor, comprising preparing a semiconductor layer between source and drain electrodes of the organic thin-film transistor using an axial substituted phthalocyanine compound, wherein the center ligand of said axial substituted phthalocyanine compound is an atom with 3 valences or higher, and the axial ligands are chlorine, fluorine, or oxygen, which can be connected with the center ligand of axial substituted phthalocyanine compounds; wherein said axial substituted phthalocyanine compound is selected from the group consisting of indium fluorine phthalocyanine, ferrum chlorine phthalocyanine, indium chlorine phthalocyanine, gallium chlorine phthalocyanine, manganese chlorine phthalocyanine, indium chlorine hexadecafluoro phthalocyanine, indium chlorine hexadecachloro phthalocyanine, manganese chlorine hexadecafluoro phthalocyanine, aluminium chlorine hexadecafluoro phthalocyanine and aluminium chlorine hexadecachloro phthalocyanine.

2. The method according to claim 1, wherein the thickness of said semiconductor layer between the source and drain electrodes of the organic thin-film transistor is between 10-50 nm.

3. A method for preparing transistor comprising preparing a semiconductor layer between source and drain electrodes of the organic thin-film transistor using an axial-substituted phthalocyanine compound, wherein the center ligand of said axial substituted phthalocyanine compound is an atom with 3 valences or higher, and the axial ligands are chlorine, fluorine, or oxygen, which can be connected with the center ligand of axial substituted phthalocyanine compounds; wherein said axial substituted phthalocyanine compound is selected from the group consisting of stannum oxygen phthalocyanine, oxygen titanium hexadecafluoro phthalocyanine, oxygen titanium hexadecachloro phthalocyanine, oxygen vanadium hexadecafluoro phthalocyanine, and oxygen vanadium hexadecachloro phthalocyanine.

4. The method according to claim 3, wherein the thickness of said semiconductor layer between the source and drain electrodes of the organic thin-film transistor is between 10-50 nm.

* * * * *